United States Patent
Su

(10) Patent No.: US 12,014,696 B2
(45) Date of Patent: Jun. 18, 2024

(54) DISPLAY SUBSTRATE, DISPLAY PANEL AND DISPLAY DEVICE, OF EACH OF WHICH A PIXEL ELECTRODE HAVING A HOLLOWED-OUT STRUCTURE WITH A PRESET SIZE

(71) Applicants: Beijing BOE Display Technology Co., Ltd., Beijing (CN); BOE TECHNOLOGY GROUP CO., LTD., Beijing (CN)

(72) Inventor: Qiujie Su, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 127 days.

(21) Appl. No.: 17/773,531

(22) PCT Filed: May 20, 2021

(86) PCT No.: PCT/CN2021/094846
§ 371 (c)(1),
(2) Date: Apr. 29, 2022

(87) PCT Pub. No.: WO2022/001460
PCT Pub. Date: Jan. 6, 2022

(65) Prior Publication Data
US 2022/0383830 A1    Dec. 1, 2022

(30) Foreign Application Priority Data
Jun. 30, 2020    (CN) .......................... 202010614944.3

(51) Int. Cl.
G09G 3/36    (2006.01)
G02F 1/1335   (2006.01)
(Continued)

(52) U.S. Cl.
CPC ..... *G09G 3/3614* (2013.01); *G02F 1/133512* (2013.01); *G02F 1/134309* (2013.01);
(Continued)

(58) Field of Classification Search
CPC ..................... G02F 1/136286; G02F 2201/52
See application file for complete search history.

(56) References Cited

U.S. PATENT DOCUMENTS 9,052,550 B2    6/2015    Cui et al.
9,070,599 B2    6/2015    Kim et al.
(Continued)

FOREIGN PATENT DOCUMENTS

CN    101206321 A    6/2008
CN    101315506 A    12/2008
(Continued)

OTHER PUBLICATIONS

China Patent Office, First Office Action dated Apr. 27, 2022, for corresponding Chinese application 202010614944.3.

*Primary Examiner* — Lauren Nguyen
(74) *Attorney, Agent, or Firm* — HOUTTEMAN LAW LLC

(57) ABSTRACT

A display substrate includes: a first base substrate (20), and gate lines (4) and data lines (5) on the first base substrate (20). The gate lines (4) extend in a first direction (X), and the data lines (5) extend in a second direction (Y). The gate lines (4) and the data lines (5) define pixel units, each of which includes a thin film transistor (7), a pixel electrode (8) and a common electrode (9). At least some of the pixel units are respectively configured with conductive bridge lines (10) provided in the same layer as the pixel electrode (8). In a pixel unit configured with the conductive bridge line (10), a first hollowed-out structure (13) and a second hollowed-out structure (14) are provided on opposite sides of the pixel (Continued)

electrode (8) in the first direction, to weaken or even eliminate mura (e.g., nonuniformity in brightness or color).

13 Claims, 9 Drawing Sheets

(51) Int. Cl.
    *G02F 1/1339*     (2006.01)
    *G02F 1/1343*     (2006.01)
    *G02F 1/136*     (2006.01)
    *G02F 1/1362*     (2006.01)
    *G02F 1/1368*     (2006.01)
    *H01L 27/12*     (2006.01)

(52) U.S. Cl.
    CPC ....  *G02F 1/13606* (2021.01); *G02F 1/136213* (2013.01); *G02F 1/136286* (2013.01); *G02F 1/1368* (2013.01); *G09G 3/3648* (2013.01); *H01L 27/124* (2013.01); *G02F 1/13394* (2013.01); *G02F 1/13439* (2013.01); *G02F 2201/52* (2013.01); *G02F 2203/52* (2013.01); *G09G 2300/0426* (2013.01); *G09G 2300/0452* (2013.01); *G09G 2300/0842* (2013.01); *G09G 2320/0233* (2013.01)

(56) References Cited

U.S. PATENT DOCUMENTS

| | | |
|---|---|---|
| 2002/0008792 A1 | 1/2002 | Chung et al. |
| 2004/0090561 A1 | 5/2004 | Song |
| 2016/0139444 A1 | 5/2016 | Zhang et al. |
| 2016/0282654 A1 | 9/2016 | Fu |
| 2022/0187666 A1 | 6/2022 | Wang et al. |

FOREIGN PATENT DOCUMENTS

| | | | | | |
|---|---|---|---|---|---|
| CN | 101398580 | A | | 4/2009 | |
| CN | 101762916 | A | | 6/2010 | |
| CN | 101770123 | A | | 7/2010 | |
| CN | 103178119 | A | | 6/2013 | |
| CN | 10-3323981 | | * | 9/2013 | ........... G02F 1/1339 |
| CN | 103323981 | A | | 9/2013 | |
| CN | 103676340 | A | | 3/2014 | |
| CN | 10-5551390 | | * | 3/2016 | ....... G02F 1/133512 |
| CN | 10-5551390 | | * | 5/2016 | ........... G02F 1/1335 |
| CN | 105551390 | A | | 5/2016 | |
| CN | 106353930 | A | | 1/2017 | |
| CN | 10-7505782 | | * | 9/2017 | ....... G02F 1/136286 |
| CN | 107505782 | A | | 12/2017 | |
| CN | 107505785 | A | | 12/2017 | |
| CN | 107589587 | A | | 1/2018 | |
| CN | 108398826 | A | | 8/2018 | |
| CN | 108983512 | A | | 12/2018 | |
| CN | 109188813 | A | | 1/2019 | |
| CN | 10-9976057 | | * | 4/2019 | ........... G02F 1/1368 |
| CN | 109976057 | A | | 7/2019 | |
| CN | 111176042 | A | | 5/2020 | |
| CN | 111258140 | A | | 6/2020 | |
| KR | 20060074325 | A1 | | 7/2006 | |
| KR | 20080057386 | A1 | | 6/2008 | |

* cited by examiner

DISPLAY SUBSTRATE, DISPLAY PANEL AND DISPLAY DEVICE, OF EACH OF WHICH A PIXEL ELECTRODE HAVING A HOLLOWED-OUT STRUCTURE WITH A PRESET SIZE

CROSS REFERENCE TO RELATED APPLICATIONS

This is a National Phase application filed under 35 U.S.C. 371 as a national stage of PCT/CN2021/094846 filed on May 20, 2021, an application claiming priority to Chinese patent application No. 202010614944.3, filed on Jun. 30, 2020, the content of each of which is incorporated herein by reference in its entirety.

TECHNICAL FIELD

The present disclosure relates to the field of display technology, and in particular to a display substrate, a display panel, and a display device.

BACKGROUND

Advanced super-Dimensional Switch (ADS) display mode has the advantages of wide viewing angle, fast response speed, high contrast ratio and high transmittance, thus has become a popular display mode and is used by many panel manufacturers for product design. However, in practical applications, it is found that the images displayed by the existing ADS type display device have obvious mura (e.g., nonuniformity in brightness or color).

SUMMARY

Some embodiments of the present disclosure provide a display substrate, a display panel, and a display device.

In a first aspect, an embodiment of the present disclosure provides a display substrate which includes: a first base substrate, and a plurality of gate lines and a plurality of data lines, which are on the first base substrate, wherein the gate lines extend in a first direction, the data lines extend in a second direction, the first direction and the second direction intersect each other and are both parallel to a plane where the first base substrate is located;

the plurality of gate lines and the plurality of data lines define a plurality of pixel units, each of the pixel units includes a thin film transistor, a pixel electrode and a common electrode, the pixel electrode is on a side of the common electrode distal to the first substrate; in a same pixel unit, a region where the pixel electrode is located and a region where the thin film transistor is located are arranged in the second direction, an end of the pixel electrode proximal to the thin film transistor is a first end, an end of the pixel electrode distal to the thin film transistor is a second end; at least some of the pixel units are configured with conductive bridge lines, respectively, the conductive bridge lines are provided in the same layer as the pixel electrode;

in the pixel unit which is configured with the conductive bridge line, a first hollowed-out structure is provided on a first side of the first end or the second end of the pixel electrode, an end of the conductive bridge line is located in the first hollowed-out structure and is connected to the common electrode through a via, and a second hollowed-out structure is provided on a second side of the second end of the pixel electrode, so that an absolute value of a difference between parasitic capacitances formed respectively by the pixel electrode and nearest data lines located on both sides of the pixel electrode is less than or equal to a preset capacitance difference; and the first side and the second side are opposite sides of the pixel electrode in the first direction.

In some embodiments, a length of the second hollowed-out structure in the second direction is equal to that of the first hollowed-out structure in the second direction.

In some embodiments, a length of the second hollowed-out structure in the first direction is less than or equal to that of the first hollowed-out structure in the first direction.

In some embodiments, the parasitic capacitances formed respectively by the pixel electrode and the nearest data lines located on both sides of the pixel electrode are equal to each other.

In some embodiments, multiple pixel units arranged in the first direction correspond to a same strip-shaped common electrode, and the strip-shaped common electrode extends in the first direction; and the common electrodes contained respectively in the multiple pixel units corresponding to the same strip-shaped common electrode are parts of the strip-shaped common electrode at different positions.

In some embodiments, the display substrate further includes common electrode lines which are provided in the same layer as the gate lines; and multiple pixel units arranged in the first direction correspond to a same common electrode line, the common electrodes in the multiple pixel units are electrically connected to a corresponding common electrode line, orthogonal projections of the second ends of the pixel electrodes in the multiple pixel units on the first base substrate overlap with an orthogonal projection of the corresponding common electrode line on the first base substrate.

In some embodiments, each of the gate lines includes: first conductive patterns and second conductive patterns arranged alternatively in the first direction, a length of each of the first conductive patterns in the second direction is greater than that of each of the second conductive patterns in the second direction;

orthogonal projections of the first conductive patterns on the first base substrate do not overlap with orthogonal projections of the data lines on the first base substrate, and a part of a corresponding first conductive pattern serves as a gate in the thin film transistor;

orthogonal projections of the conductive bridge lines on the first base substrate do not overlap with the orthogonal projections of the first conductive patterns on the first base substrate.

In some embodiments, all the pixel units in the display substrate include: a red pixel unit, a green pixel unit and a blue pixel unit; and the blue pixel unit is configured with the conductive bridge line.

In some embodiments, each of some of the pixel units is provided with a first limit block and a second limit block, each of some of the pixel units has a preset light outgoing region, and the first limit block and the second limit block are located at two opposite sides of the preset light outgoing region in the second direction, respectively; and each of the first limit block and the second limit block includes a first limiting pattern and a second limiting pattern that are stacked together, the first limiting pattern is arranged in the same layer as the gate lines, and the second limiting pattern is arranged in the same layer as the data lines.

In some embodiments, all the pixel units in the display substrate include: a red pixel unit, a green pixel unit and a blue pixel unit; and the red pixel unit is provided with the first limit block and the second limit block.

In a second aspect, an embodiment of the present disclosure further provides a display panel which includes: a display substrate and an opposite substrate arranged oppositely, and a liquid crystal layer being filled between the display substrate and the opposite substrate, wherein the display substrate is the display substrate according to the above first aspect.

In some embodiments, for any one of the pixel units, when a polarity of a data voltage applied to a nearest data line on a side of the pixel electrode is inverted, an amount of change in a voltage applied to the pixel electrode in the pixel unit due to the polarity inversion is $\Delta Vp$:

$$\Delta Vp = Cpd1 * \Delta Vd / (Cpd1 + Cpd2 + Cst + Clc + Cgp)$$

where Cpd1 represents a parasitic capacitance formed between the pixel electrode in the pixel unit and the data line where the polarity inversion occurs, $\Delta Vd$ represents a difference between the data voltage applied after the polarity inversion and the data voltage applied before the polarity inversion on the data line where the polarity inversion occurs, Cpd1+Cpd2 represents a sum of parasitic capacitances formed respectively between the pixel electrode in the pixel unit and the nearest data lines located on both sides of the pixel electrode, Cst represents a storage capacitance between the pixel electrode in the pixel unit and the common electrode, Clc represents a liquid crystal capacitance at the pixel unit, and Cgp represents a parasitic capacitance between the pixel electrode in the pixel unit and the gate line.

In some embodiments, the opposite substrate is a color filter substrate which includes: a second base substrate, and color filter patterns and a black matrix which are located on the second base substrate;

the black matrix defines multiple pixel light outgoing openings being in one-to-one correspondence with the pixel units, and the color filter patterns are located in the pixel light outgoing openings, respectively; and an orthogonal projection of the black matrix on the first base substrate completely covers orthogonal projections of the gate lines, the data lines, the thin film transistor, the first hollowed-out structure and the second hollowed-out structure on the first base substrate.

In some embodiments, the thin film transistor in each pixel unit is electrically connected to the data line located on the second side of the pixel unit;

the pixel unit includes: a red pixel unit, a green pixel unit and a blue pixel unit;

a shape of a pixel opening corresponding to the red pixel unit includes: a first rectangular portion, and a first protrusion and a second protrusion formed by extending two corner regions of the first rectangular portion located on the second side outward along the second direction;

a shape of a pixel opening corresponding to the green pixel unit includes: a second rectangular portion, and a third protrusion and a fourth protrusion formed by extending two corner regions of the second rectangular portion located on the first side outward along the second direction; and a shape of a pixel opening corresponding to the blue pixel unit includes: a third rectangular portion;

alternatively, a shape of the pixel opening corresponding to the blue pixel unit includes: a third rectangular portion, a fifth protrusion formed by extending a corner region of the third rectangular portion on the first side and also located on a third side outward along the second direction, and a sixth protrusion formed by extending a corner region of the third rectangular portion on the second side and also located on a fourth side outward along the second direction, wherein the third side and the fourth side are two opposite sides of the third rectangular portion in the second direction.

In some embodiments, the display substrate is provided with a first limit block and a second limit block, and the color filter substrate further includes a spacer, the spacer is located on a side of the black matrix distal to the second base substrate, a projection of the spacer on the display substrate is located between a first limit block and a second limit block adjacent to each other in the second direction, and the first and second limit blocks adjacent to each other are located in two pixel units adjacent to each other in the second direction, respectively.

In a third aspect, an embodiment of the present disclosure further provides a display device which includes the display panel according to the above second aspect.

DETAIL DESCRIPTION OF EMBODIMENTS

In order for one of ordinary skill in the art to better understand the technical solutions of the present disclosure, a display substrate, a display panel and a display device provided by the present disclosure will be described in detail below with reference to the accompanying drawings.

In order to solve the problem that the images displayed by a display device in the related art have obvious mura, in the present disclosure, the causes of the mura in the related art is analyzed, and corresponding solutions are provided.

In a liquid crystal display device, in order to avoid the problem of liquid crystal fatigue caused by that liquid crystal molecules are always deflected in a certain direction, a polarity inversion method is used for driving in a display driving process. Common polarity inversion methods include: row inversion, column inversion and dot inversion.

In an ADS type display device, since the distances between the pixel electrode in a pixel unit and the data lines on both sides thereof are relatively short (generally 3 μm to 5 μm), parasitic capacitance is formed between the pixel electrode and the nearest data lines on both sides of the pixel electrode. When the polarity of the data voltage applied to a data line is inverted, the data voltage on the data line undergoes a large jump, and the parasitic capacitance coupling between the data line and the pixel electrode will change the voltage applied to the pixel electrode. In order to minimize the influence of the polarity inversion of the data voltage on the data line on the voltage applied to the pixel electrode as much as possible, the polarities of the data voltages applied to two adjacent data lines in a display panel are often set to be opposite to each other. In this case, for any pixel unit, when the polarities of the data voltages on the nearest data lines on both sides of the pixel electrode are inverted, the data voltage on one of the data lines jumps from positive polarity to negative polarity (the parasitic capacitance between this data line and the pixel electrode will pull down the voltage applied to the pixel electrode), and the data voltage on another data line jumps from negative polarity to positive polarity (the parasitic capacitance between this data line and the pixel electrode will pull up the voltage applied to the pixel electrode), so as to balance the influence of the polarity inversion of the data voltages on the data lines on the voltage applied to the pixel electrode.

Figure 1:
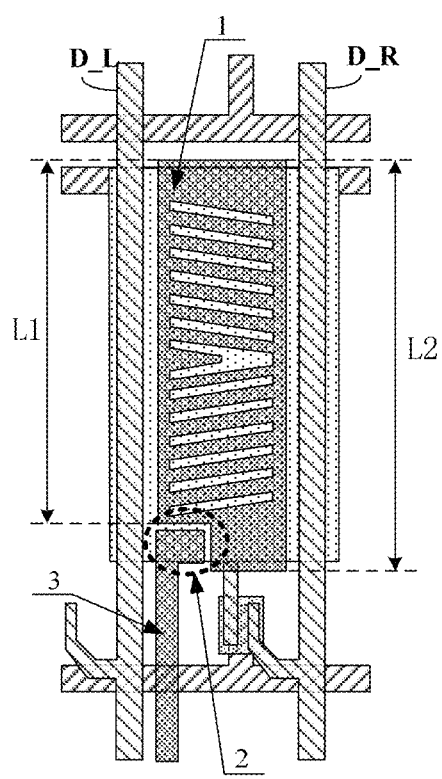
FIG. 1 is a top view of a pixel unit configured with (or receiving therein) a conductive bridge line in the related art.
Figure 2:
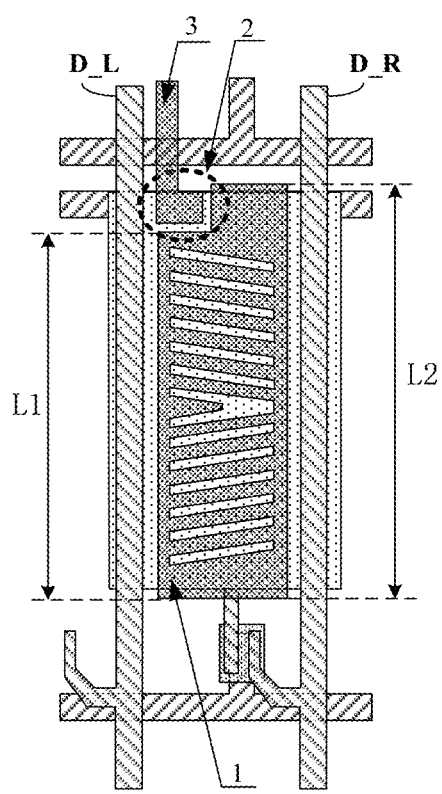
FIG. 2 is a top view of another pixel unit configured with (or receiving therein) a conductive bridge line in the related art.

FIG. 1 is a top view of a pixel unit configured with (or receiving therein) a conductive bridge line in the related art, and FIG. 2 is a top view of another pixel unit configured with (or receiving therein) a conductive bridge line in the related art. As shown in FIGS. 1 and 2, generally, the pixel electrode 1 in the pixel unit is in the shape of a parallelogram (for example, a rectangle) as a whole; however, in the ADS type display panel, some pixel units need to be configured with conductive bridge lines 3 (electrically connected to the common electrode through vias, respectively) which are arranged in the same layer as the pixel electrodes 1; since each conductive bridge line 3 may occupy part of the area on a corresponding pixel electrode 1, the corresponding pixel electrode 1 needs to be provided with a hollowed-out structure 2 to receive an end of the conductive bridge line 3. FIG. 1 exemplarily depicts a case in which the hollowed-out structure 2 for receiving the end of the conductive bridge line 3 is located at the lower left corner of the pixel electrode 1, and FIG. 2 exemplarily depicts a case in which the hollowed-out structure 2 for receiving the end of the conductive bridge line 3 is located at the upper left corner of the pixel electrode 1.

Continuing to refer to FIGS. 1 and 2, the length of the first part of the pixel electrode 1 that can generate parasitic capacitance with the left data line D_L is L1, and the length of the second part of the pixel electrode 1 that can generate parasitic capacitance with the right data line D_R is L2. At this time, the parasitic capacitance between the first part and the left data line D_L is Cpd_L, and the parasitic capacitance between the second part and the right data line D_R is Cpd_R. Since L1<L2, Cpd_L<Cpd_R. The difference between Cpd_L and Cpd_R is recorded as ΔCpd, and ΔCpd=|Cpd_L−Cpd_R|. Through actual measurement, it is found that L2-L1>20 microns (μm), and ΔCpd=|Cpd_L−Cpd_R|>1.2 femtofarads (fF). Due to the large value of ΔCpd, even if different polarity inversions are performed on the data lines on the left and right sides at the same time, the voltage applied to the pixel electrode 1 will be also changed greatly, and the brightness change of the pixel unit is greater than 2 gray levels, causing a user to obviously feel the abnormal brightness.

Figure 3:
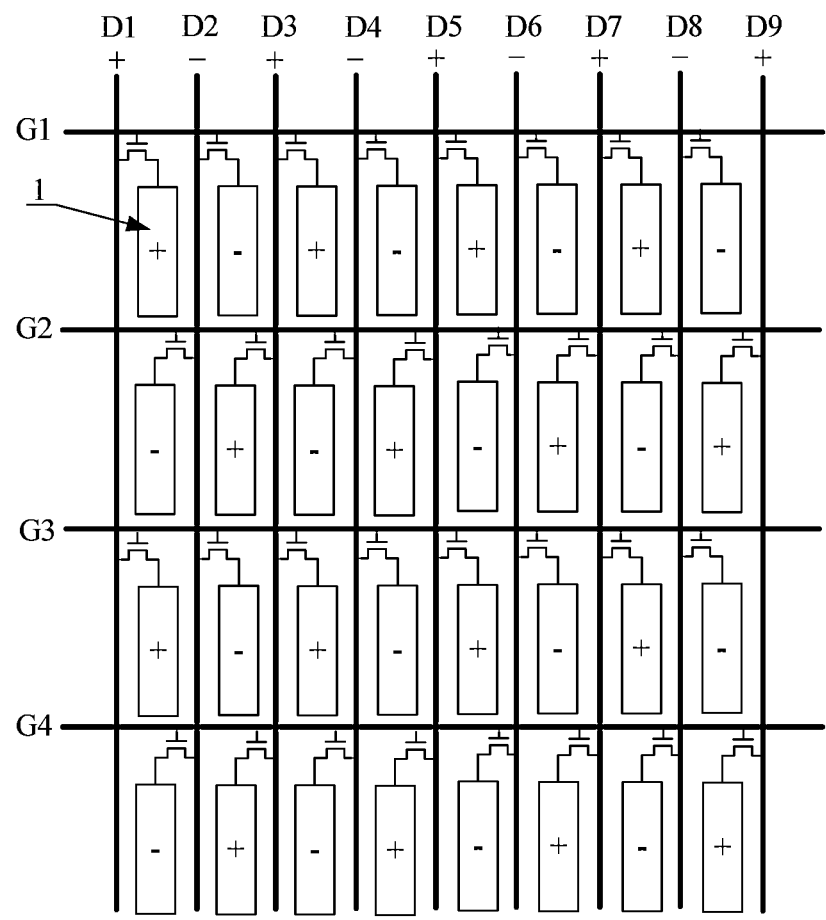
FIG. 3 is a schematic diagram of a circuit structure in which pixel units are arranged using a Z-inversion arrangement in the present disclosure.

FIG. 3 is a schematic diagram of a circuit structure in which pixel units are arranged using a Z-inversion arrangement in the present disclosure. As shown in FIG. 3, the arrangement in which the pixel units in the display substrate are arranged using a Z-inversion arrangement is taken as an example; specifically, the pixel units located in the i-th row are connected to the i-th gate line G1/G2/G3/G4, the pixel units located in the odd-numbered rows are connected to the nearest data lines on the first side thereof (e.g., the left side of the pixel units in the figure), respectively. The pixel units located in the even-numbered rows are connected with the nearest data lines on the second side thereof (e.g., the right side of the pixel units in the figure), respectively. When the pixels are driven, the column inversion method is adopted for driving, that is, the polarities of the data voltages applied to the adjacent data lines are opposite to each other, so that the effect of dot inversion of the display panel can be achieved. FIG. 3 exemplarily shows a case in which the data voltages applied to the data lines D1, D3, D5, D7, and D9 in the odd-numbered columns have positive polarity (+), and the data voltages applied to the data lines D2, D4, D6, and D8 in the even-numbered columns have negative polarity (−).

Figure 4:
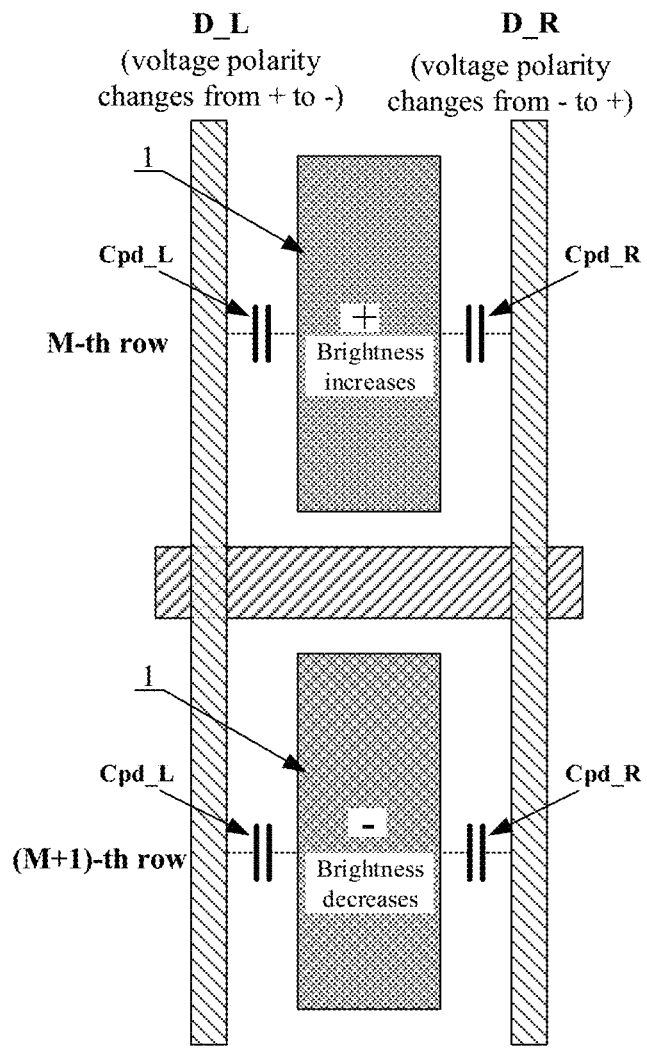
FIG. 4 is a schematic diagram of a circuit structure of two pixel units located in the same column and adjacent rows in FIG. 3.

FIG. 4 is a schematic diagram of a circuit structure of two pixel units located in the same column and adjacent rows in FIG. 3. As shown in FIG. 4, the voltage applied to the pixel electrode 1 in the pixel unit located in the M-th row has positive polarity, the voltage applied to the pixel electrode 1 in the pixel unit located in the (M+1)-th row has negative polarity, the data voltage applied to the left data line D_L jumps from positive polarity to negative polarity, and the data voltage applied to the right data line D_R jumps from negative polarity to positive polarity.

When the polarity of the data voltage applied to the left data line D_L is inverted (jumps from positive to negative), the coupling effect of the parasitic capacitance between the left data line D_L and the pixel electrode 1 will make the voltage applied to the pixel electrode 1 be pulled down by ΔVp_L:

$$\Delta Vp\_L = Cpd\_L * \Delta Vd\_L / (Cpd\_L + Cpd\_R + Cst + Clc + Cgp);$$

where Cpd_L represents a parasitic capacitance formed between the pixel electrode 1 and the left data line D_L, Cpd_R represents a parasitic capacitance formed between the pixel electrode 1 and the right data line D_R, ΔVd_L represents an amount of change in the voltage when the polarity of the data voltage on the left data line D_L is inverted (i.e., the absolute value of the difference between the data voltage after the polarity inversion and the data voltage before the polarity inversion), Cst represents a storage capacitance between the pixel electrode 1 and the common electrode, Clc represents a liquid crystal capacitance at the pixel unit, Cgp represents a parasitic capacitance between the pixel electrode 1 and the gate line.

When the polarity of the data voltage applied to the right data line D_R is inverted (jumps from negative to positive), the coupling effect of the parasitic capacitance between the right data line D_R and the pixel electrode 1 will make the voltage applied to the pixel electrode 1 be pulled up by ΔVp_R:

$$\Delta Vp\_R = Cpd\_R * \Delta Vd\_R/(Cpd\_L + Cpd\_R + Cst + Clc + Cgp)$$

where ΔVd_R represents an amount of change in the voltage when the polarity of the data voltage on the right data line D_R is inverted (i.e., the absolute value of the difference between the data voltage after the polarity inversion and the data voltage before the polarity inversion).

For the convenience of description, it is set that ΔVd_L=ΔVd_R, and in this case, after the polarities of the data voltages on the left and right data lines are inverted, the amount of change in the voltage on the pixel electrode 1 is |ΔVp_L−ΔVp_R|:

$$|\Delta Vp\_L - \Delta Vp\_R| = |Cpd\_L - Cpd\_R| * \Delta Vd\_R/(Cpd\_L + Cpd\_R + Cst + Clc + Cgp)$$

Taking the pixel electrode 1 shown in FIG. 1 as an example, Cpd_L<Cpd_R, so the voltage on the pixel electrode 1 will be pulled up by (Cpd_R−Cpd_L)*ΔVd_R/(Cpd_L+Cpd_R+Cst+Clc+Cgp). For the M-th row of pixel units, the magnitude of the applied positive voltage increases, and the display brightness increases; for the (M+1)-th row of pixel units, the magnitude of the applied negative voltage decreases, and the display brightness decreases; the brightness difference between two adjacent rows of pixel units is significant, resulting in horizontal mura, and the larger the value of |Cpd_L−Cpd_R|, the more significant the brightness difference.

In the related art, since the hollowed-out structure 2 that is for receiving the conductive bridge line 3 and is formed in the pixel electrode 1 results in a large difference between the parasitic capacitances formed by the pixel electrode 1 and the left and right data lines, respectively, there are obvious abnormalities in the pixel unit during the display process. In order to solve this technical problem, the embodiments of the present disclosure provide corresponding solutions.

Figure 5:
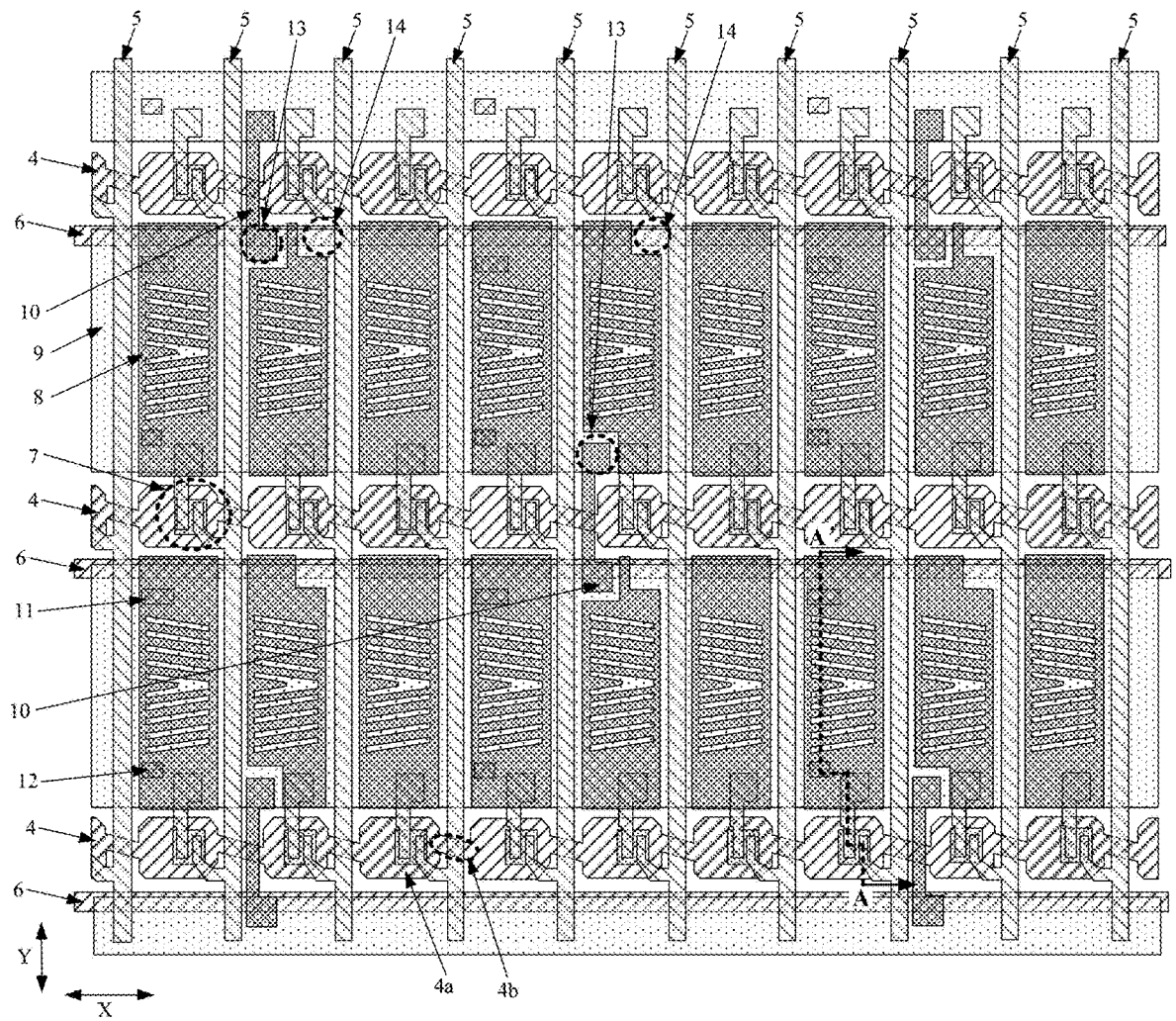
FIG. 5 is a top view of a display substrate according to an embodiment of the present disclosure.
Figure 6:
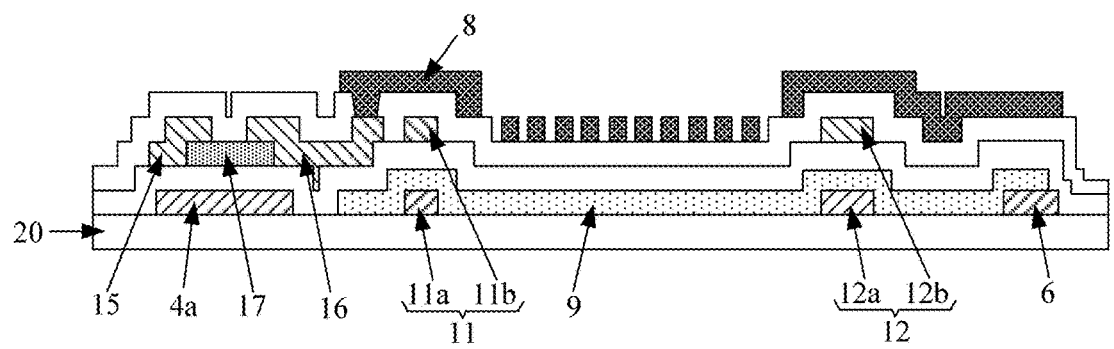
FIG. 6 is a cross-sectional view of the display substrate shown in FIG. 5 taken along a direction A-A'.

FIG. 5 is a top view of a display substrate according to an embodiment of the present disclosure, and FIG. 6 is a cross-sectional view of the display substrate shown in FIG. 5 taken along a direction A-A'. As shown in FIGS. 5 and 6, the display substrate is an ADS type display substrate, and the display substrate includes: a first base substrate 20, and multiple (i.e., a plurality of) gate lines 4 and multiple data lines 5 located on the first base substrate 20. The gate lines 4 extend in a first direction X, the data lines 5 extend in a second direction Y, the first direction X and the second direction Y intersect each other and are both parallel to a plane where the first base substrate 20 is located. In the embodiment of the present disclosure, exemplary description is made by taking the example that the first direction X is the row direction and the second direction Y is the column direction.

The multiple gate lines 4 and the multiple data lines 5 define multiple pixel units. Each of the pixel units includes: a thin film transistor 7, a pixel electrode 8 and a common electrode 9. The pixel electrode 8 is a slit electrode and is located on a side of the common electrode 9 away from (i.e., distal to) the first substrate 20. In a same pixel unit, a region where the pixel electrode 8 is located and a region where the thin film transistor 7 is located are arranged in the second direction Y, an end of the pixel electrode 8 close to (i.e., proximal to) the thin film transistor 7 is a first end, an end of the pixel electrode 8 away from the thin film transistor 7 is a second end. At least some of the pixel units are configured with conductive bridge lines 10, respectively, and the conductive bridge lines 10 are provided in the same layer as the pixel electrodes 8.

For example, the thin film transistor 7 includes a gate electrode, a source electrode 15, a drain electrode 16 and an active layer 17. FIG. 5 only exemplarily shows a case in which the gate electrode of the thin film transistor 7 in each pixel unit is connected to the corresponding row of gate line 4 (or to the gate line 4 in a corresponding row), and the source electrode 15 of the thin film transistor 7 in each pixel unit is connected to the nearest data line 5 on the right side of the pixel unit. This case is only an example, and will not limit the technical solution of the present disclosure. The pixel units in the present disclosure may also be arranged in other manners, for example, in the Z-inversion arrangement.

In addition, FIG. 5 only exemplarily shows a case in which there is one pixel unit configured with the conductive bridge line 10 in every three pixel units, which is only an example and will not limit the technical solution of the present disclosure. In practical applications, the pixel units each may be configured with the conductive bridge lines 10, or some of the pixel units may be configured with the conductive bridge lines 10, respectively.

Figure 7A:
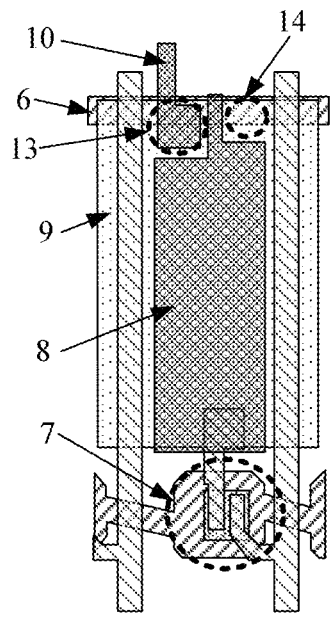
FIG. 7*a* is a top view of a pixel unit configured with (or receiving therein) a conductive bridge line according to an embodiment of the present disclosure.
Figure 7B:
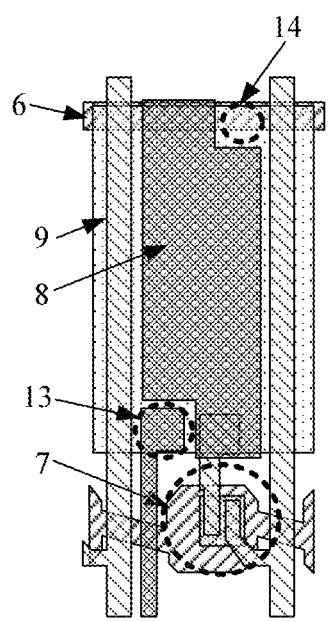
FIG. 7*b* is a top view of another pixel unit configured with (or receiving therein) a conductive bridge line according to an embodiment of the present disclosure.

FIG. 7a is a top view of a pixel unit configured with (or receiving therein) a conductive bridge line according to an embodiment of the present disclosure, and FIG. 7b is a top view of another pixel unit configured with (or receiving therein) a conductive bridge line according to an embodiment of the present disclosure. As shown in FIGS. 7a and 7b, in a pixel unit which is configured with the conductive bridge line 10, a first hollowed-out structure 13 is provided on a first side of the first end or the second end of the pixel electrode 8, an end of the conductive bridge line 10 is located in the first hollowed-out structure 13 and is connected to the common electrode 9 through a via, and a second hollowed-out structure 14 is provided on a second side of the second end of the pixel electrode 8, so that an absolute value of a difference between parasitic capacitances formed respectively by the pixel electrode 8 and the nearest data lines 5 located on both sides of the pixel electrode 8 is less than or equal to a preset capacitance difference; the first side and the second side are opposite sides of the pixel electrode 8 in the first direction X. Taking the case shown in FIG. 5 as an example, the first side specifically refers to the left side, and the second side specifically refers to the right side.

It should be noted that, in the cases shown in FIGS. 7a and 7b, the first end and the second end of the pixel electrode 8 refer to the lower end and the upper end of the pixel electrode 8, respectively. FIG. 7b exemplarily depicts a case in which the first hollowed-out structure 13 is located on the left side of the lower end (the first hollowed-out structure 13 is located at the lower left corner of the pixel unit), and FIG. 7a exemplarily depicts the first hollowed-out structure 13 located on the left side of the upper end (the first hollowed-out structure 13 is located at the upper left corner of the pixel unit), and correspondingly, the second hollowed-out structure 14 is located on the right side of the upper end. The cases shown in FIGS. 7a and 7b are only examples, and will not limit the technical solutions of the present disclosure.

In some embodiments, a length of the second hollowed-out structure 14 in the second direction Y is equal to that of the first hollowed-out structure 13 in the second direction Y, which is beneficial to realize equal or approximately equal parasitic capacitances formed by the pixel electrode 8 and the nearest data lines 5 located on both sides of the pixel electrode 8, respectively.

Generally, a part of the pixel electrode 8 with the horizontal distance from the data line 5 less than 6 μm can form a parasitic capacitance with the data line 5. For convenience of description, the part of the pixel electrode 8 that can form parasitic capacitance with the left data line 5 is called the first part, and the part of the pixel electrode 8 that can form parasitic capacitance with the right data line 5 is called the second part.

In the embodiment of the present disclosure, the above-mentioned second hollowed-out structure 14 is provided on the pixel electrode 8 provided with the first hollowed-out structure 13, and the second hollowed-out structure 14 and the first hollowed-out structure 13 have equal or similar lengths in the second direction Y, so that the length L1 of the first part of the pixel electrode 8 in the second direction Y and the length L2 of the second part of the pixel electrode 8 in the second direction Y are equal or approximately equal to each other, which causes the parasitic capacitance Cpd_L formed between the first part and the left data line 5 and the parasitic capacitance Cpd_R formed between the second part and the right data line 5 to satisfy the following: |Cpd_L−Cpd_R| is less than or equal to the preset capacitance difference; thereby effectively reducing or even eliminating the influence on the voltage applied to the pixel electrode 8 when the data voltages on the data lines 5 on both sides of the pixel electrode 8 are simultaneously inverted in polarity, which is beneficial to weakening or even eliminating mura.

Considering that an excessively long length of the second hollowed-out structure 14 in the second direction Y may have certain influence on the pixel aperture ratio; for this reason, in some embodiments, under the condition that |Cpd_L−Cpd_R| is less than or equal to the preset capacitance difference, the length of the second hollowed-out structure 14 in the second direction Y may be not greater than the length of the first hollowed-out structure in the Y direction length.

In some embodiments, the preset capacitance difference is less than or equal to 1.0 fF. When the parasitic capacitances formed respectively by the pixel electrode 8 and the nearest data lines 5 on both sides of the pixel electrode 8 are equal, that is, Cpd_L=Cpd_R, the influence on the voltage applied to the pixel electrode 8 when the data voltages on the data lines 5 on both sides of the pixel electrode 8 are inverted in polarity simultaneously can be effectively eliminated, thereby effectively eliminating the mura.

In practical applications, it is found that a part of the pixel electrode 8 with the distance from the data line 5 in the first direction X greater than 6 μm is relatively far away from the data line 5, so no significant parasitic capacitance will be generated. In addition, the length of the second hollowed-out structure 14 in the first direction X should not be too large, because the longer the length of the second hollowed-out structure 14 in the first direction X is, the smaller the overall size of the pixel electrode 8 is, and the storage capacitance formed between the pixel electrode 8 and the common electrode 9 is reduced such that the ability of the pixel electrode 8 to maintain the gray-scale voltage is weakened. Based on the above factors, in the embodiment of the present disclosure, the length of the second hollowed-out structure 14 in the first direction X is greater than or equal to 6 μm and less than or equal to the length of the first hollowed-out structure 13 in the first direction X.

In some embodiments, multiple pixel units arranged in the first direction X correspond to a same strip-shaped common electrode 9, and the strip-shaped common electrode extends in the first direction X. The common electrodes contained respectively in the multiple pixel units corresponding to the same strip-shaped common electrode are parts of this strip-shaped common electrode 9 at different positions. That is, the pixel units located in the same row correspond to the same strip-shaped common electrode 9.

In some embodiments, the display substrate further includes common electrode lines 6 which are provided in the same layer as the gate lines 4. Multiple pixel units arranged in the first direction X correspond to a same common electrode line 6. The common electrodes 9 in the pixel units are electrically connected to the corresponding common electrode line 6, and orthogonal projections of the second ends of the pixel electrodes 8 on the first base substrate 20 overlap with an orthogonal projection of the corresponding common electrode line 6 on the first base substrate 20.

It should be noted that two structures "being provided in a same layer" as described in the present disclosure means that the two structures are obtained based on the patterning of a same material film, and the distances between the two structures and a base substrate may be equal to each other or different from each other.

As shown in FIG. 6, in the embodiment of the present disclosure, the common electrode 9 is directly lapped on (e.g., overlaps with and directly contacts to) the common electrode line 6. Since the orthogonal projection of the second end of the pixel electrode 8 on the first base substrate 20 overlaps with the orthogonal projection of the common electrode line 6 on the first base substrate 20, the second hollowed-out structure 14 provided at the second end overlaps with the common electrode line 6. Since the region where the common electrode line 6 is located will be covered by a black matrix, the arrangement of the second hollowed-out structure 14 will not substantially affect the aperture ratio of the pixel unit. Preferably, the orthogonal projection of the second hollowed-out structure 14 on the first base substrate 20 is located in the region defined by the orthogonal projection of the common electrode line 6 on the first base substrate 20. In this case, the second hollowed-out structure 14 will not affect the aperture ratio of the pixel unit.

In some embodiments, each gate line 4 includes: first conductive patterns 4a and second conductive patterns 4b arranged alternatively in the first direction X, and a length of each first conductive pattern 4a in the second direction Y is greater than that of each second conductive pattern 4b in the second direction Y; orthogonal projections of the first conductive patterns 4a on the first base substrate 20 do not overlap with orthogonal projections of the data lines 5 on the first base substrate 20, and a part of each first conductive pattern 4a serves as the gate electrode of a corresponding thin film transistor 7; orthogonal projections of the conductive bridge lines 10 on the first base substrate 20 do not overlap with the orthogonal projections of the first conductive patterns 4a on the first base substrate 20.

In an embodiment of the present disclosure, the length of each of the first conductive patterns 4a in the second direction Y is relatively large, which can effectively reduce the overall resistance of a corresponding gate line 4 and facilitate the loading and transmission of signals. Meanwhile, the length of each of the second conductive patterns 4b in the second direction Y is relatively small, and an overlapping area between each of the second conductive patterns 4b and a data line 5, or between each of the conductive bridge lines 10 and a corresponding second conductive pattern 4b is relatively small, so the formed parasitic capacitance is relatively small, which can effectively reduce the signal crosstalk between a gate line 4 and a data line 5, or between a gate line 4 and a conductive bridge line 10.

In some embodiments, all the pixel units in the display substrate include: a red pixel unit, a green pixel unit and a blue pixel unit; and the blue pixel unit is configured with the conductive bridge line 10. For example, an area of a light outgoing region for the red pixel unit is less than an area of a light outgoing region for the blue pixel unit, and the area of the light outgoing region for the blue pixel unit is less than an area of a light outgoing region for the green pixel unit. Generally, under the same aperture ratio, since a light transmittance of the green pixel is the highest, it is not considered to sacrifice the aperture ratio of the green pixel, but to arrange the conductive bridge line in the blue pixel unit.

In some embodiments, each of some of the pixel units are provided with a first limit block 11 and a second limit block 12, and has a preset light outgoing region; and the first limit block 11 and the second limit block 12 are located at two opposite sides of the preset light outgoing region in the second direction Y, respectively; the first limit block 11 includes a first limiting pattern 11a, and a second limiting pattern 11b that are stacked together, and the second limit block 12 includes a first limiting pattern 12a and a second limiting pattern 12b that are stacked together; the first limiting patterns 11a, 12a are arranged in the same layer as the gate lines, and the second limiting patterns 11b, 12b are arranged in the same layer as the data lines. First limit blocks 11 and second limit blocks 12 are used to limit the positions of spacers 18 after the display substrate and an opposite substrate are assembled into a cell, so as to prevent the spacers 18 from sliding.

In some embodiments, each red pixel unit is provided with the first limit block 11 and the second limit block 12. The provided limit blocks may reduce the aperture ratio of the pixel unit where they are provided and thus affect the light transmittance of the pixel unit; in addition, a human eye is most sensitive to green. Under the same aperture ratio, the light transmittance of each green pixel unit is the highest, so it is not considered to sacrifice the aperture ratio of the green pixel. Moreover, the aperture ratio of each blue pixel unit has a greater influence on a color temperature. The larger the aperture ratio of each blue pixel unit is, the higher the color temperature is. Therefore, generally, it is also not considered to sacrifice the aperture ratio of each blue pixel unit. Based on the above considerations, each red pixel unit is provided with the limit blocks.

Figure 8:
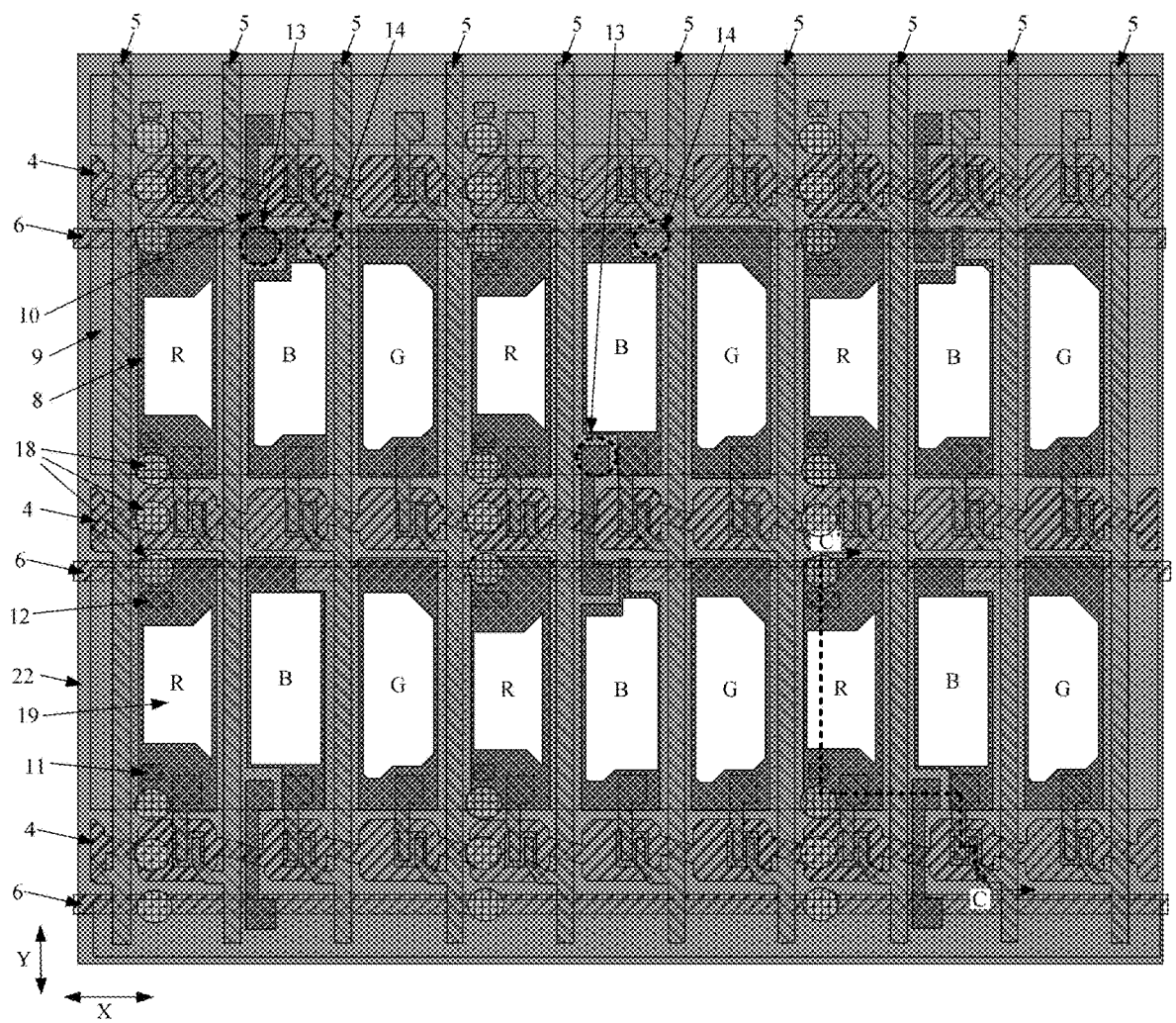
FIG. 8 is a top view of a display panel according to an embodiment of the present disclosure.
Figure 9:
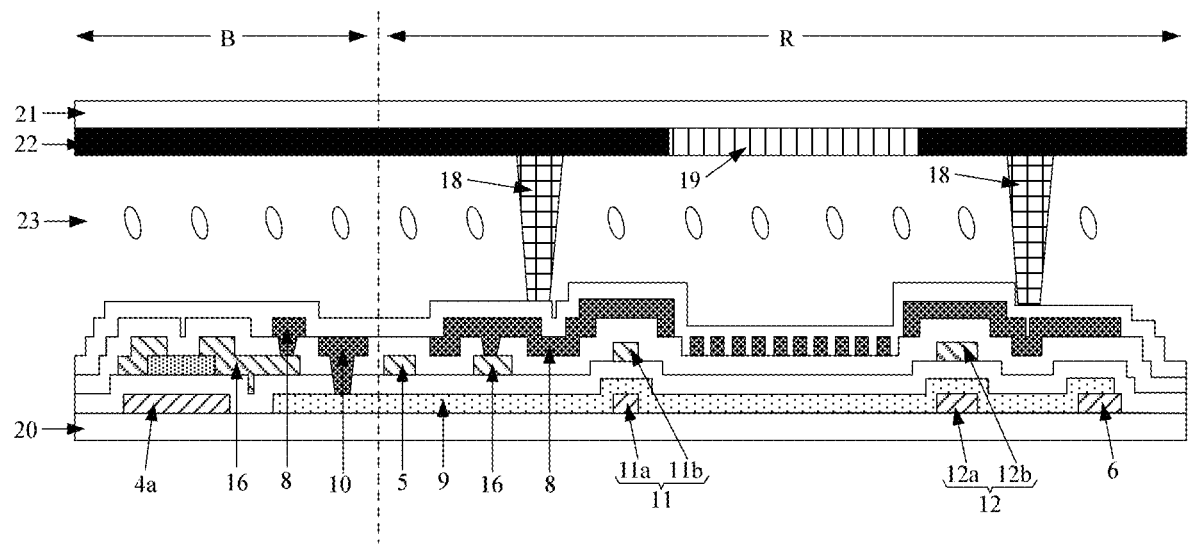
FIG. 9 is a cross-sectional view of the display panel shown in FIG. 8 taken along a direction C-C'.

FIG. 8 is a top view of a display panel according to an embodiment of the present disclosure, and FIG. 9 is a cross-sectional view of the display panel shown in FIG. 8 taken along a direction C-C'. As shown in FIGS. 8 and 9, the display panel includes a display substrate and an opposite substrate arranged oppositely, a liquid crystal layer 23 is filled between the display substrate and the opposite substrate, and the display substrate is the display substrate provided in any one of the above embodiments. For the description of the display substrate, reference may be made to the contents in the above embodiments, and details thereof are not repeated here.

In some embodiments, for any one of the pixel units, when a polarity of a data voltage applied to a nearest data line 5 on a side of the pixel unit is inverted, an amount of change in a voltage applied to the pixel electrode 8 in the pixel unit due to the polarity inversion is ΔVp:

$$\Delta Vp = Cpd1 * \Delta Vd/(Cpd1+Cpd2+Cst+Clc+Cgp)$$

where Cpd1 represents a parasitic capacitance formed between the pixel electrode 8 in the pixel unit and the data line 5 where the polarity inversion occurs, ΔVd represents a difference between the data voltage applied after the polarity inversion and the data voltage applied before the polarity inversion on the data line 5 where the polarity inversion occurs, Cpd1+Cpd2 represents a sum of parasitic capacitances formed respectively between the pixel electrode 8 in the pixel unit and the nearest data lines 5 located on both sides of the pixel electrode 8 (or of the pixel unit), Cst represents a storage capacitance between the pixel electrode 8 in the pixel unit and the common electrode 9, Clc represents a liquid crystal capacitance at the pixel unit, and Cgp represents a parasitic capacitance between the pixel electrode 8 in the pixel unit and a corresponding gate line 4.

In some embodiments, the opposite substrate is a color filter substrate which includes: a second base substrate 21, and color filter patterns 19 and a black matrix 22 that are located on the second base substrate 21; the black matrix defines multiple pixel light outgoing openings, the pixel light outgoing openings are in one-to-one correspondence with the pixel units so as to define the light outgoing regions of the pixel units, and the color filter patterns 19 are located in the pixel light outgoing openings, respectively; an orthogonal projection of the black matrix 22 on the first base substrate 20 completely covers orthogonal projections of the gate lines 4, the data lines 5, the thin film transistors 7, the first hollowed-out structures 13 and the second hollowed-out structures 14 on the first base substrate 20.

In some embodiments, the thin film transistor in a pixel unit is electrically connected to the data line located on the second side of the pixel unit; the pixel unit includes: a red pixel unit R, a green pixel unit G, and a blue pixel unit B.

Figure 10:
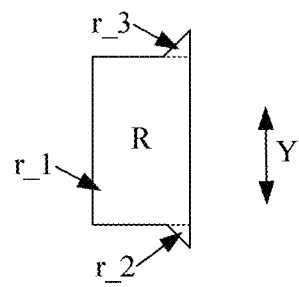
FIG. 10 is a schematic diagram of a shape of a pixel opening corresponding to a red pixel unit according to an embodiment of the present disclosure.

FIG. 10 is a schematic diagram of a shape of a pixel opening corresponding to a red pixel unit according to an embodiment of the present disclosure. As shown in FIG. 10, in some embodiments, the shape of the pixel opening corresponding to the red pixel unit R includes: a first rectangular portion r_1, and a first protrusion r_2 and a second protrusion r_3 formed by extending two corner regions of the first rectangular portion r_1 located on the second side of the red pixel unit outward along the second direction Y.

Figure 11:
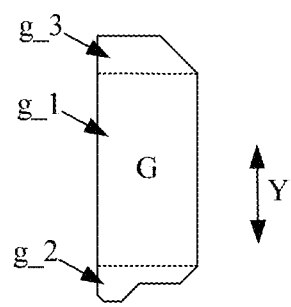
FIG. 11 is a schematic diagram of a shape of a pixel opening corresponding to a green pixel unit according to an embodiment of the present disclosure.

FIG. 11 is a schematic diagram of a shape of a pixel opening corresponding to a green pixel unit according to an embodiment of the present disclosure. As shown in FIG. 11, in some embodiments, the shape of the pixel opening corresponding to the green pixel unit G includes: a second rectangular portion g_1, and a third protrusion g_2 and a fourth protrusion g_3 formed by extending two corner regions of the second rectangular portion g_1 located on the first side of the green pixel unit outward along the second direction Y.

Figure 12A:
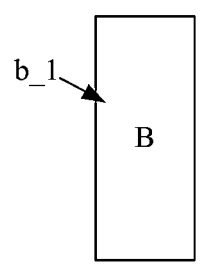
FIG. 12*a* is a schematic diagram of a shape of a pixel opening corresponding to a blue pixel unit according to an embodiment of the present disclosure.

FIG. 12a is a schematic diagram of a shape of a pixel opening corresponding to a blue pixel unit according to an embodiment of the present disclosure. As shown in FIG. 12a, in some embodiments, the shape of the pixel opening corresponding to the blue pixel unit B includes: a third rectangular portion b_1.

Figure 12B:
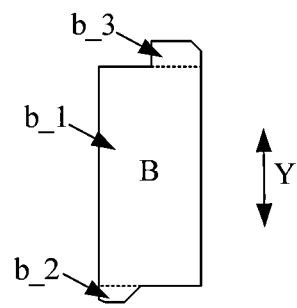
FIG. 12b is a schematic diagram of another shape of a pixel opening corresponding to a blue pixel unit according to an embodiment of the present disclosure.

FIG. 12b is a schematic diagram of another shape of a pixel opening corresponding to a blue pixel unit according to an embodiment of the present disclosure. As shown in FIG. 12b, the shape of the pixel opening corresponding to the blue pixel unit B includes: a third rectangular portion b_1, a fifth protrusion b_2 formed by extending a corner region (the corner region located on the lower left side) of the third rectangular portion b_1 on the first side and also located on a third side of the blue pixel unit outward along the second direction Y, and a sixth protrusion b_3 formed by extending a corner region (the corner region located on the upper right side) of the third rectangular portion b_1 on the second side and also located on a fourth side of the blue pixel unit outward along the second direction Y; the third side and the fourth side are two opposite sides of the third rectangular portion in the second direction Y. As shown in FIGS. 8 and 12b, the third side specifically refers to the lower side, and the fourth side specifically refers to the upper side.

It should be noted that the shapes of the pixel openings shown in FIGS. 8 and 10 to 12b are only exemplary and will not limit the technical solutions of the present disclosure. In practical applications, the pixel openings can be designed and adjusted according to actual requirements.

In the display panel shown in FIG. 8, it is exemplarily drawn that all the pixel units include red pixel units R, green pixel units G, and blue pixel units B, each of the blue pixel units B is configured with a conductive bridge 10, and each of the red pixel units R is provided with a first limit block 11 and a second limit block 12.

In some embodiments, the display substrate is provided with first limit blocks 11 and second limit blocks 12, and the color filter substrate further includes spacers 18. The spacers 18 are located on a side of the black matrix 22 away from the second base substrate 21. An orthogonal projection of each spacer on the display substrate is located between a first limit block 11 and a second limit block 12 adjacent to each other in the second direction Y, and the first limit block 11 and second limit block 12 adjacent to each other are located in two pixel units adjacent to each other in the second direction Y, respectively. The positions of the spacers 18 can be limited by the limit blocks, so as to prevent the spacers 18 from sliding to the light outgoing regions of the pixel units.

An embodiment of the present disclosure also provides a display device which includes a display panel, and the display panel is the display panel in the above embodiments. For the description of the display panel, reference may be made to the contents in the above embodiments, and details thereof are not repeated here.

The display device provided by the embodiment of the present disclosure may specifically be any product or component with a display function, such as a liquid crystal display device, electronic paper, a mobile phone, a tablet computer, a television, a monitor, a laptop computer, a digital photo frame, a navigator, etc.

It should be understood that the above embodiments are merely exemplary embodiments adopted to illustrate the principles of the present disclosure, but the present disclosure is not limited thereto. For one of ordinary skill in the art, various modifications and improvements can be made without departing from the spirit and essence of the present disclosure, and such modifications and improvements are also regarded as falling within the protection scope of the present disclosure.

What is claimed is:

1. A display panel, comprising: a display substrate and an opposite substrate arranged oppositely, and a liquid crystal layer being filled between the display substrate and the opposite substrate, wherein the display substrate comprises: a first base substrate, and a plurality of gate lines and a plurality of data lines, which are on the first base substrate, wherein the gate lines extend in a first direction, the data lines extend in a second direction, the first direction and the second direction intersect each other and are both parallel to a plane where the first base substrate is located;

the plurality of gate lines and the plurality of data lines define a plurality of pixel units, each of the pixel units comprises a thin film transistor, a pixel electrode and a common electrode, the pixel electrode is on a side of the common electrode distal to the first substrate; in a same pixel unit, a region where the pixel electrode is located and a region where the thin film transistor is located are arranged in the second direction, an end of the pixel electrode proximal to the thin film transistor is a first end, an end of the pixel electrode distal to the thin film transistor is a second end; at least some of the pixel units are configured with conductive bridge lines, respectively, the conductive bridge lines are provided in the same layer as the pixel electrode;

in the pixel unit which is configured with the conductive bridge line, a first hollowed-out structure is provided on a first side of the first end or the second end of the pixel electrode, an end of the conductive bridge line is located in the first hollowed-out structure and is connected to the common electrode through a via, and a second hollowed-out structure is provided on a second side of the second end of the pixel electrode, so that an absolute value of a difference between parasitic capacitances formed respectively by the pixel electrode and nearest data lines located on both sides of the pixel electrode is less than or equal to a preset capacitance difference;

the first side and the second side are opposite sides of the pixel electrode in the first direction;

wherein, for any one of the pixel units, a polarity of a data voltage applied to a nearest data line on a side of the pixel electrode is inverted, and an amount of change in a voltage applied to the pixel electrode in the pixel unit due to the polarity inversion is $\Delta Vp$:

$$\Delta Vp = Cpd1 * \Delta Vd / (Cpd1 + Cpd2 + Cst + Clc + Cgp)$$

where Cpd1 represents a parasitic capacitance formed between the pixel electrode in the pixel unit and the data line where the polarity inversion occurs, $\Delta Vd$ represents a difference between the data voltage applied after the polarity inversion and the data voltage applied before the polarity inversion on the data line where the polarity inversion occurs, Cpd1+Cpd2 represents a sum of parasitic capacitances formed respectively between the pixel electrode in the pixel unit and nearest data lines located on both sides of the pixel electrode, Cst represents a storage capacitance between the pixel electrode in the pixel unit and the common electrode, Clc represents a liquid crystal capacitance at the pixel unit, and Cgp represents a parasitic capacitance between the pixel electrode in the pixel unit and the gate line;

wherein the opposite substrate is a color filter substrate which comprises: a second base substrate, and color filter patterns and a black matrix which are located on the second base substrate;

the black matrix defines multiple pixel light outgoing openings being in one-to-one correspondence with the pixel units, and the color filter patterns are located in the pixel light outgoing openings, respectively; and an orthogonal projection of the black matrix on the first base substrate completely covers orthogonal projections of the gate lines, the data lines, the thin film transistor, the first hollowed-out structure and the second hollowed-out structure on the first base substrate.

2. The display panel of claim 1, wherein the thin film transistor in each pixel unit is electrically connected to the data line located on the second side of the pixel unit;

the pixel unit comprises: a red pixel unit, a green pixel unit and a blue pixel unit;

a shape of a pixel opening corresponding to the red pixel unit comprises: a first rectangular portion, and a first protrusion and a second protrusion formed by extending two corner regions of the first rectangular portion located on the second side outward along the second direction;

a shape of a pixel opening corresponding to the green pixel unit comprises: a second rectangular portion, and a third protrusion and a fourth protrusion formed by extending two corner regions of the second rectangular portion located on the first side outward along the second direction; and a shape of a pixel opening corresponding to the blue pixel unit comprises: a third rectangular portion; or a shape of the pixel opening corresponding to the blue pixel unit comprises: a third rectangular portion, a fifth protrusion formed by extending a corner region of the third rectangular portion on the first side and also located on a third side outward along the second direction, and a sixth protrusion formed by extending a corner region of the third rectangular portion on the second side and also located on a fourth side outward along the second direction, wherein the third side and the fourth side are two opposite sides of the third rectangular portion in the second direction.

3. The display panel of claim 1, wherein in the display substrate, each of some of the pixel units is provided with a first limit block and a second limit block, each of the some of the pixel units has a preset light outgoing region, and the first limit block and the second limit block are located at two opposite sides of the preset light outgoing region in the second direction, respectively;

each of the first limit block and the second limit block comprises a first limiting pattern and a second limiting pattern that are stacked together, the first limiting pattern is arranged in the same layer as the gate lines, and the second limiting pattern is arranged in the same layer as the data lines;

all the pixel units in the display substrate comprise: a red pixel unit, a green pixel unit and a blue pixel unit; and the red pixel unit is provided with the first limit block and the second limit block; and the color filter substrate further comprises a spacer, the spacer is located on a side of the black matrix distal to the second base substrate, a projection of the spacer on the display substrate is located between a first limit block and a second limit block adjacent to each other in the second direction, and the first and second limit blocks adjacent to each other are located in two pixel units adjacent to each other in the second direction, respectively.

4. A display device, comprising the display panel of claim 1.

5. The display panel of claim 1, wherein a length of the second hollowed-out structure in the second direction is equal to that of the first hollowed-out structure in the second direction.

6. The display panel of claim 1, wherein a length of the second hollowed-out structure in the first direction is less than or equal to that of the first hollowed-out structure in the first direction.

7. The display panel of claim 1, wherein the parasitic capacitances formed respectively by the pixel electrode and the nearest data lines located on both sides of the pixel electrode are equal to each other.

8. The display panel of claim 1, wherein multiple pixel units arranged in the first direction correspond to a same strip-shaped common electrode, and the strip-shaped common electrode extends in the first direction; and the common electrodes contained respectively in the multiple pixel units corresponding to the same strip-shaped common electrode are parts of the strip-shaped common electrode at different positions.

9. The display panel of claim 1, further comprising common electrode lines which are provided in the same layer as the gate lines; and multiple pixel units arranged in the first direction correspond to a same common electrode line, the common electrodes in the multiple pixel units are electrically connected to a corresponding common electrode line, orthogonal projections of the second ends of the pixel electrodes in the multiple pixel units on the first base substrate overlap with an orthogonal projection of the corresponding common electrode line on the first base substrate.

10. The display panel of claim 9, wherein each of the gate lines comprises: first conductive patterns and second conductive patterns arranged alternatively in the first direction, a length of each of the first conductive patterns in the second direction is greater than that of each of the second conductive patterns in the second direction;

orthogonal projections of the first conductive patterns on the first base substrate do not overlap with orthogonal projections of the data lines on the first base substrate, and a part of a corresponding first conductive pattern serves as a gate in the thin film transistor; and orthogonal projections of the conductive bridge lines on the first base substrate do not overlap with the orthogonal projections of the first conductive patterns on the first base substrate.

11. The display panel of claim 1, wherein all the pixel units in the display substrate comprise: a red pixel unit, a green pixel unit and a blue pixel unit; and the blue pixel unit is configured with the conductive bridge line.

12. The display panel of claim 1, wherein each of some of the pixel units is provided with a first limit block and a second limit block, each of the some of the pixel units has a preset light outgoing region, and the first limit block and the second limit block are located at two opposite sides of the preset light outgoing region in the second direction, respectively; and each of the first limit block and the second limit block comprises a first limiting pattern and a second limiting pattern that are stacked together, the first limiting pattern is arranged in the same layer as the gate lines, and the second limiting pattern is arranged in the same layer as the data lines.

13. The display panel of claim 12, wherein all the pixel units in the display substrate comprise: a red pixel unit, a green pixel unit and a blue pixel unit; and the red pixel unit is provided with the first limit block and the second limit block.

\* \* \* \* \*